United States Patent [19]

Greenwald et al.

[11] Patent Number: 5,070,026

[45] Date of Patent: Dec. 3, 1991

[54] PROCESS OF MAKING A FERROELECTRIC ELECTRONIC COMPONENT AND PRODUCT

[75] Inventors: Anton C. Greenwald, North Andover; Bobby L. Buchanan, Carlisle, both of Mass.

[73] Assignee: Spire Corporation, Bedford, Mass.

[21] Appl. No.: 371,548

[22] Filed: Jun. 26, 1989

[51] Int. Cl.$^5$ ............... H01L 31/18; H01L 21/00
[52] U.S. Cl. ............... 437/3; 437/51; 437/52; 437/915; 365/145
[58] Field of Search ............... 29/830–832, 29/841; 437/51, DIG. 915, 3, 52; 357/67, 25, 29, 30

[56] References Cited

U.S. PATENT DOCUMENTS

| | | | |
|---|---|---|---|
| 3,368,920 | 7/1968 | Hagenlocher | 118/712 |
| 3,443,170 | 5/1969 | Pulvari | 357/4 |
| 3,689,992 | 9/1972 | Schutze et al. | 148/DIG. 145 |
| 3,997,690 | 4/1976 | Chen | 427/162 |
| 4,056,654 | 2/1977 | Kompanek | 428/409 |
| 4,079,284 | 3/1978 | Fanshawe | 29/832 |
| 4,149,302 | 4/1979 | Cook | 29/841 |
| 4,636,908 | 7/1987 | Yoshihara et al. | 361/321 |
| 4,715,680 | 4/1987 | Kawaguchi et al. | 350/96.34 |
| 4,895,812 | 1/1990 | Wang et al. | 148/DIG. 93 |
| 4,926,051 | 5/1990 | Turnbull | 437/3 |
| 4,954,458 | 9/1990 | Reid | 437/915 |

FOREIGN PATENT DOCUMENTS

| | | |
|---|---|---|
| 0173368 | 5/1986 | European Pat. Off. . |
| 53-148294 | 12/1978 | Japan . |
| 59-035098 | 2/1984 | Japan . |
| 61-169013 | 7/1986 | Japan . |
| 63-23123 | 1/1988 | Japan . |
| 1-005999 | 1/1989 | Japan . |

OTHER PUBLICATIONS

D. W. Chapman, "Some Thin-Film Properties of a New Ferroelectric Composition", *J. Appl. Phys.*, vol. 40, No. 6 (May 1969), pp. 2381–2385.

S. B. Krupanidhi et al., "rf Planar Magnetron Sputtering and Charac. of Ferroelectric . . . ", J. Appl. Phys. 54 (11), Nov. 1983, pp. 6601–6609.

Makoto Ishida et al., "Electro–Optic Effects of PLZT Thin Films", Applied Physics Letters, vol. 31, No. 7 (Oct. 1977), 433–434.

M. Ishida et al., "Preparation and Properties of Ferroelectric PLZT Thin Films by rf Sputtering", Journal of Applied Physics, vol. 48, No. 3 (Mar. 1977), 951–953.

K. Sreenivas, M. et al., "Surface Acoustic Wave Propagation on Lead Zirconate Titanite Thin Films", Appl. Phys. Lett. (52) (Feb. 1988), pp. 709–711.

Michael Schneider, "Flip Chip Bonding Offers Packaging Alternative", *Hybrid Circuit Technology* (Mar. 1988), pp. 29–31.

*Primary Examiner*—Olik Chaudhuri
*Assistant Examiner*—Andrew Griffis
*Attorney, Agent, or Firm*—Morse, Altman, Dacey & Benson

[57] ABSTRACT

An improved process of making a ferroelectric electronic component, such as a non-volatile RAM or an electro-optic switching array, is disclosed. The process essentially includes the separate formation of two subassemblies and then connecting them by placing one on top of the other. Electrical contacts are made by "bumping" or other "flip chip" techniques.

11 Claims, 1 Drawing Sheet

PROCESS OF MAKING A FERROELECTRIC ELECTRONIC COMPONENT AND PRODUCT

BACKGROUND OF THE INVENTION

1. Field of the Invention

The present invention relates generally to a process of making a ferroelectric electronic component and the product of that process and, more particularly, to an improved process characterized by the separate formation of two subassemblies and then connecting these to form the final products by placing one subassembly on top of the other.

2. The Prior Art

In the late 1960's, a new ceramic ferroelectric composition in the form of a thin film had been developed for use in logic and memory devices. See D. W. Chapman, "Some Thin-Film Properties of a New Ferroelectric Composition," *J. Appl. Phys.*, Vol. 40, No. 6 (May 1969), pp. 2381-2385. Ferroelectric materials are crystalline substances displaying ferroelectricity, i.e., spontaneous electric polarization.

During the next two decades, workers in the field experimented with ferroelectric materials for thin film devices including barium titanate for thermistors, lead titanate for pyroelectric detectors, bismuth titanate for nonvolatile memory devices and lead zirconate titanate (PZT) for capacitors, electro-optic and nonvolatile memory devices. See S. B. Krupanidhi et al, "rf planar magnetron sputtering and characterization of ferroelectric Pb (Zr, Ti) $O_3$ films, "*J. Appl. Phys*' 54 (11), November 1983, pp. 6601-6609. Fabrication of such ferroelectric thin film devices included vacuum deposition techniques such as electron beam evaporation, ion-beam deposition, rf sputtering and chemical vapor deposition, and also chemical sol gel processing and coating. See, inter alia, U.S. Pat. Nos. 3,368,920 that issued to A. K. Hagenlocher in Feb. 13, 1968; 3,997,690 that issued to Chen on Dec. 14, 1976; 4,056,654 that issued to Kompanek on Nov. 1, 1977; and 4,636,908 that issued to Yoshihara et al on Jan. 13, 1987. For an optical switch employing a layer of PLZT see U.S. Pat. No. 4,715,680 that issued to Kawaguchi et al on Dec. 29, 1987.

Among the problems encountered have been microcracking in the thin films due to thermal mismatch and the incompatibility between substrates and the ferroelectric material due to crystal lattice mismatch. These problems of fabrication have adversely affected the widespread use of such ferroelectric thin film devices.

SUMMARY OF THE INVENTION

It is a principal object of the present invention to overcome the above disadvantages by providing an improved process of making ferroelectric electronic components, and the components so made, characterized by separately forming two subassemblies and then connecting them by placing one on top of the other to form the final products.

More specifically, it is an object of the present invention to provide a process of making ferroelectric electronic components, such as non-volatile RAM's and optoelectric switching arrays and the components so made, comprising providing a first substrate of a suitable material, forming a conductive larger thereon, forming a layer of ferroelectric material on the conductive layer to form a first subassembly, providing a second substrate of the same suitable material, forming an integrated circuit on this second substrate, forming a plurality of electrical contacts on the integrated circuit to form a second subassembly, and connecting the two subassemblies to form the electronic component by placing one on top of the other such that the plurality of electrical contacts of one subassembly abut and make electrical contact with the layer of ferroelectric material of the other subassembly. Preferably, the substrate material is silicon, gallium arsenide, sapphire or other suitable material with like thermal expansion coefficients. Preferably, the conductive layer is one that does not change its properties even when exposed to oxygen at elevated temperatures, such as a noble metal including gold and platinum, or a conductive oxide, such as, $SnO_2$ or $InSnO_2$. Preferably, the ferroelectric material is lead zirconate titanate (PZT), PZLT or lead germanate. Both the conductive layer and the layer of ferroelectric material may be patterned. In an alternate process according to the invention, the layer of ferroelectric material of the first subassembly also is provided with a second conductive layer patterned mirrorlike to reflect the plurality of electrical contacts formed on the second subassembly. As a consequence, when the two subassemblies are placed one on top of the other, the second patterned conductive layer aligns precisely with the electrical contacts of the second subassembly. The process may utilize any known thin film deposition technique, including sol gel processing. Preferably however, MOCVD and sputtering are employed.

Other objects of the present invention will in part be obvious and will in part appear hereinafter.

The invention accordingly comprises the improved process of making electronic components of the present disclosure and the electronic components so made, its components, parts and their interrelationships, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings, wherein.

DETAILED DESCRIPTION OF THE PREFERRED EMBODIMENTS

Figure 1:
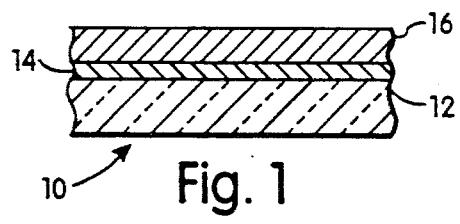
FIGS. 1-8 are schematic cross-sectional views, on an enlarged scale, illustrating the process of making electronic components according to the invention.
Figure 4:
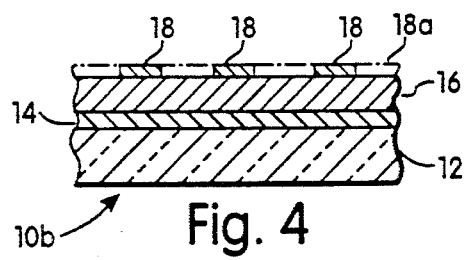

Generally, the illustrated process according to the invention involves the manufacture of electronic components, such as nonvolatile random access memories (NVRAMs), optoelectronic switching arrays, and the like. NVRAM's are computer storage mediums characterized by retaining information even in the absence of power. Integrated optical devices today are densely packed and are required to operate at ever increasing speeds. Thin films materials, some of which are opaque or transparent, particularly of ferroelectric composition exhibit good optically nonlinear properties. As such, these ferroelectric thin film materials are in great demand for, inter alia, integrated optics characterized by high density and speed. The preferred ferroelectric material in thin film device manufacture is lead zirconate titanate, Pb (Zr, Ti) O$_3$, known as PZT. As known, undoped bulk PZT is an opaque ferroelectric material. As also known, the addition of lanthanum to form La-doped PZT (PLZT) causes the material to become transparent and to exhibit favorable electo-optic properties. PZT also possesses a large pyroelectric response, a large electro-mechanical coupling coefficient as well as large spontaneous polarization. As also known, the thickness of the PZT or PLZT thin films materially affects their thin film properties, such as their dielectric constant, remanent polarization and coercive field. Ferroelectric thin film devices have been made by vacuum deposition techniques, including ion beam deposition, electron beam evaporation, rf sputtering and chemical vapor deposition, as well as by chemical sol gel processing and coating.

The challenge of all known fabrication techniques involved the manufacture of crack-free ferroelectric devices. Microcracking in the thin films occurs because of the thermal mismatch coefficients between adjacent layers of different materials as they are deposited and the incompatibility of the several deposition processes for the ferroelectric material and the completed silicon or gallium arsenide integrated circuit due to some extent to crystal lattice mismatch.

Thermal and crystal lattice mismatch introduces severe stresses in the devices as they are formed. Microcracked devices render them unsuitable for the tasks they were designed for, resulting in large numbers of rejects. The process of the invention obviates thermal and crystal lattice mismatch, improves the quality of the deposited layers, and is cost-efficient by materially reducing the number of rejects due to microcracking. Although the process of the invention can be effected by any known process, metalorganic chemical vapor deposition (MOCVD) and sputtering are preferred. For MOCVD, a CVD reaction chamber as disclosed in U.S. Pat. No. 4,596,208 is preferred. U.S. Pat. No. 4,596,208 issued al. on June 24, 1986 and is assigned to a common assignee herein, the Spire Corporation of Bedford Mass. The disclosure of said U.S. Pat. No. 4,596,208 is incorporated herein by reference. For sputtering, including subsequent annealing, a Vactec dc magnetron sputtering system is preferred, see A. Croteau et al., "Proceedings of the 6th IEEE International Symposium on Applications of Ferroelectrics, June 8-11, 1986, Bethlehem, Penna.," *IEEE*, N.Y., 1986, pp. 606-609.

Essentially, the improved process of the invention for manufacturing electronic components using ferroelectric materials includes the separate formation of two sub-assemblies, one involving the ferroelectric material and the other the integrated circuit provided with electrical contacts, and then establishing electrical connection between the ferroelectric material and the integrated circuit by sandwiching the two subassemblies together by placing one on top of the other.

Figure 7:
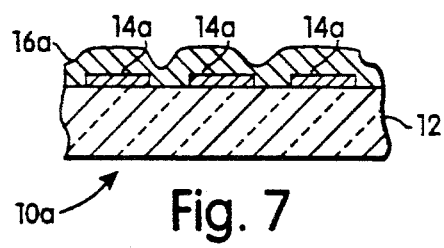
Figure 8:
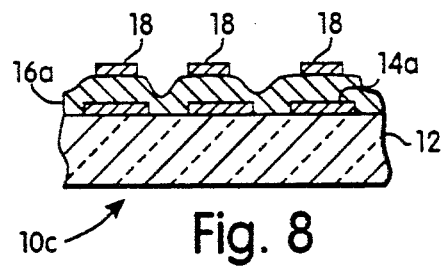
Figure 9:
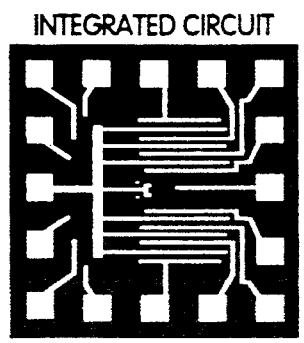
FIG. 9 depicts a photomicrograph of one representative sample of an integrated circuit that can be employed in the process according to the invention to make an electronic component.

Reference is now to be had to the drawings, wherein FIGS. 1-8 are schematic cross sections, on an enlarged scale, illustrating the process of the invention, and FIG. 9 is a photomicrograph of one representative sample of an integrated circuit.

Figure 2:
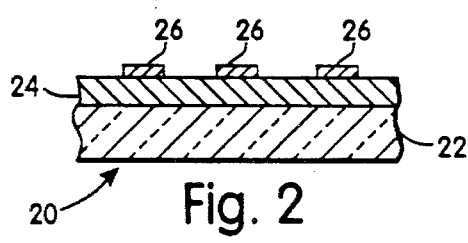
Figure 5:
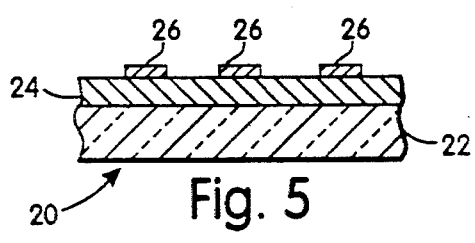

In FIGS. 1 and 2 are respectively shown subassemblies 10 and 20. Each subassembly 10 and 20 is formed on a substrate 12 and 22, respectively. Preferably, the material forming both substrates 12 and 22 is identical, matching thus thermal expansion coefficients exactly. Preferably, this substrate material is either silicon, sapphire or gallium arsenide. Alternately, the substrates may be pairs of polycrystalline and single crystal material of the same composition, such as alumina for substrate 12 and sapphire for substrate 22. The substrates 12 and 22 first are polished and cleaned. Such polishing and cleaning is effected in a manner consistent with the particular deposition process selected. The two preferred deposition processes are MOCVD and sputtering. In MOCVD, the polishing and cleaning of the substrate is effected by chemical solutions in ultrasonic baths followed by etching in the deposition system using, for example, dilute HCl gas. When employing sputtering, the polishing and cleaning of the substrate is effected by chemical solutions in ultrasonic baths followed by sputter etching the substrate surface using, for example, argon ions.

Next, a conductive layer 14 is formed on the substrate 12. This conductive layer 14 preferably is formed of a material characterized by not changing its properties when exposed to oxygen at elevated temperatures, such as a noble metal, including gold and platinum, and conductive oxides, such as SnO$_2$ and InSnO$_2$. It is the presence of this conductive layer 14 that enables the deposition, without problems of thermal and/or lattice mismatch, of the ferroelectric material as a next layer 16. It is to be noted that herein the conductive layer 14 is not patterned, nor is the layer 16 of ferro- electric material. There are certain advantages to this, namely that an etching step is eliminated, that potential defects in the final electronic component are reduced and, that there is no need to planarize it since already it is flat. There are, however, other design considerations which, at times and on balance, do outweigh the above-enumerated advantages. A patterned approach is illustrated in FIG. 7. There, a subassembly 10a is shown comprising the same substrate 12, but with both the thereon deposited conductive layer 14a and the layer 16a of ferroelectric material being patterned, with the layer 16a being also partially etched so as to effect good contact with the underlying patterned conductive layer 14a.

The second subassembly 20 is formed separately from the first subassembly 10. The second subassembly 20 is formed on the substrate 22, which preferably also is formed of the same identical material as comprises substrate 12. Consequently, thermal expansion coefficients are matched exactly between the two subassemblies 10 and 20. On the preferably polished and cleaned substrate 22, an integrated circuit 24 is formed. As known, an integrated circuit 24 is essentially an interconnected array of active and passive elements deposited on the substrate 22 in a continuous series of compatible process steps, which integrated circuit 24 is capable of performing at least one, and probably more than one, complete electronic circuit function. The precise structure of the electronic circuit 24 is, of course, determined by the desired end product being fabricated. As such, it can and does vary widely, not only as between RAMs and switching arrays but also between RAMs and RAMs and switching arrays and switching arrays. One representative sample of an integrated circuit is illustrated in FIG. 9. The illustration in FIG. 9 depicts in plan view a photomicrograph of a simple MOS integrated circuit, which is a three-input logic gate circuit. It is understood that the integrated circuit 24 is used for control and readout and the layer 16 of ferroelectric material functions as a capacitor for the resultant electronic component being fabricated.

Figure 3:
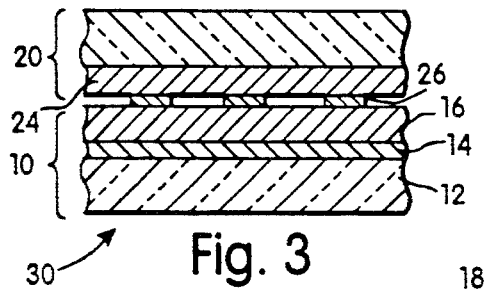
Figure 6:
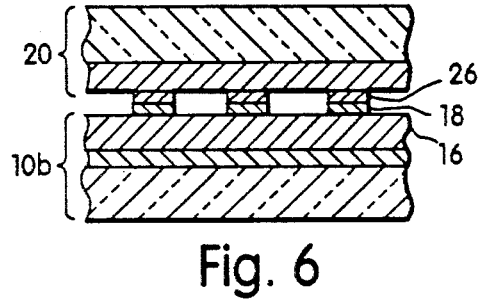

A plurality of electrical contacts 26 are next formed on top of the integrated circuit 24. These contacts 26 can be formed by tape automated bonding (TAB) or by flip chip bonding (FCB). Preferably, the plurality of electrical contacts 26 are formed of indium or gold. Indium has proven itself for use in applications when the electronic component may be exposed to wide temperature variations, including cryogenic temperatures. These electrical contacts 26 serve as one set of contacts electrically coupling the integrated circuit 24 to the layer 16 of ferroelectric material serving as the capacitor, when the two subassemblies 10 and 20 are connected into an electronic component 30, as illustrated in FIG. 3. The connection is effected by placing one subassembly 20 on top of the other subassembly 10 such that the plurality of electrical contacts 26 abut the layer 16 of ferroelectric material. Thereafter, the thus completed electronic component 30 is finalized for its end-use, depending on whether it is a RAM, a NVRAM, an optoelectronic switching array or some other device.

When employing a patterned subassembly 10a, as shown in and described with reference to FIG. 7, more care in fabrication and alignment of the two subassemblies is required to assure that the plurality of electrical contacts 26 are deposited on the integrated circuit 24 such that they abut the protruding portion of the now patterned and partially etched layer 16a of ferroelectric material. Of course, when subassembly 10 is used, which is not patterned, the need precisely to align the two subassemblies 10 and 20 is eliminated when they are sandwiched together to form the complete electronic component 30.

Practical and operational considerations can require that a more intimate electrical contact be achieved between the integrated circuit 24 and the layer 16 of ferroelectric material, in addition to that provided by the plurality of electrical contacts 26. Such more intimate electrical contact is achieved by the addition of a plurality of second electrical contacts 18 on top of the layer 16 of ferroelectric material 16 in the subassembly 10b illustrated in FIG. 4. In all other respects, subassembly 10b is identical with subassembly 10 of FIG. 1. Preferably, this plurality of second electrical contacts 18 are formed on top of the layer 16 of ferroelectric material by first depositing it as a layer 18a of metal, followed by patterning the same, as by etching. The etching step can be effected by employing photolithography, x-ray lithography, and the like, combined with plasma etching, wet chemical etching, and the like. Preferably, this plurality of second electrical contacts 18 also are formed of the same metal as the first electrical contacts 26 formed on the integrated circuit 24. The second subassembly 20, shown in FIG. 5, remains unaltered from that shown in FIG. 2.

Great care must now be exercised when connecting the two subassemblies 10b and 20 by placing one on top of the other to ensure that the two sets of electrical contacts 18 and 26, respectively formed on the ferroelectric material 16 and the integrated circuit 24, are precisely aligned and touch one another. This precise alignment must be effected within one half of the smallest size of a typical one of the plurality of electrical contacts 18 and 26, that smallest size typically being about ten microns.

In FIG. 8 is shown a subassembly 10c, which is similar to subassembly 10a depicted in and described with reference to FIG. 7. Subassembly 10c also shows a patterned conductive layer 14a, a thereupon deposited patterned and partially etched layer 16a of ferroelectric material and, a plurality of layer 16a, substantially as shown. The further assembly of second electrical contacts now formed on the heights of the the subassemblies 10c and 20 now proceeds as above described with reference to FIG. 6.

EXAMPLE I

An electronic component, such as a NVRAM, is formed by MOCVD according to the invention process as follows, employing a CVD reaction chamber as described in said U.S. Pat. No. 4,596,208.

A first silicon substrate of a thickness of about 0.5 mm and of a size of about 100 mm diameter is placed on a susceptor in the reaction chamber. The substrate is brought to and maintained at a deposition temperature of about 500° C., within a preferred temperature range from about 200° C. about 700° C. The pressure within the reaction chamber is maintained at about one atmosphere. The gas mixture admitted to the reaction chamber should nominally include 98% helium, 1% oxygen and 1% of the source material in correct proportion. Suggested source materials are tetraethyl-lead, titanium-ethoxide, and tetrakis-(diethylamino)-zirconium. The source temperature at the bubbler preferably is about 15° C. for the lead and titanium compounds, 100° C. for the zirconium compounds. The line temperature must be maintained above 100° C.

First, the substrate is polished and cleaned by HCL etching in situ. Next, a conductive layer of platinum in thickness of 100 nm is deposited on the substrate by MOCVD. Then, the layer of ferroelectric material is formed on the platinum layer. The growth rate is about 0.5 micron/minute.

An integrated circuit is then formed on a second silicon substrate of the same size as the first substrate, with a plurality of electrical contacts formed of indium provided on its surface.

Finally, the two separately formed subassemblies are connected to each other by placing one on top of the other such that the electrical contacts at the integrated circuit abut the ferroelectric material.

EXAMPLE II

An electronec component, such as an electro-optic switching array, is formed by sputtering according to the inventive process as follows, employing a Vactek dc magnetron sputtering system.

The sputtering and annealing conditions are as follows.

| | |
|---|---|
| Sputtering gas | 100% oxygen |
| Sputtering pressure | 40 microns (5.33 Pa) |
| Substrate-target distance | 10 cm |
| Input power density | 0.64 w/cm$^2$ |
| Deposition rate | 15 A/min |
| Post deposition anneal | 550° C. for 15 h in air |

Dc magnetron sputtering rotating target, consisting of different areas Pb, Ti, Zr in correct proportion.

First, a first GaAs substrate of a thickness of about 0.5 mm and of a size of about 50 mm was placed on the rotating target and a conductive layer of platinum of a thickness of about 100 nm is formed thereon. Thereafter, a layer of ferroelectric material of about 1000 nm thickness is formed on the conductive layer in a deposition lasting about 2 hours.

Next, a second GaAs substrate of identical dimensions is employed to form an integrated circuit with electrical contacts of indium formed on top of the integrated circuit driver.

Thereafter, the two separately formed subassemblies are connected to one another by placing one on top of the other such that the electrical contacts of the integrated circuit abut the ferroelectric material.

Thus it has been shown and described an improved process of making an electronic component, such as a NVRAM or an electro-optic switching array, which process satisfies the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. An MOCVD process of making a nonvolatile random access memory component comprising:
   (a) forming by MOCVD a first subassembly on a first substrate;
   (b) depositing by MOCVD a smooth conductive layer of a noble metal on said first substrate;
   (c) depositing by MOCVD a ferroelectric material on said smooth conductive layer;
   (d) forming MOCVD a second subassembly on a second substrate, said first substrate and said second substrate being formed of the same material;
   (e) depositing by MOCVD an integrated circuit on said second substrate;
   (f) forming a plurality of electrical contacts on said integrated circuit; and
   (c) connecting said two subassemblies by placing one on top of the other such that said electrical contacts abut said layer of ferroelectric material.

2. The process of claim 1 wherein said substrate material is one of a group consisting of silicon, gallium arsenide, and sapphire.

3. The process of claim 1 wherein said layer of ferroelectric material is one of a group consisting of PZT, PZLT, and lead-germanate.

4. The process of claim 1 wherein said smooth conductive layer is characterized by a crystal lattice structure and a thermal coefficient compatible with said ferroelectric material to enable its MOCVD deposition on said first substrate.

5. The process of claim 4 wherein said conductive layer is one of a group consisting of noble metals, gold and platinum, and conductive oxides, $SnO_2$ and $InSnO_2$.

6. The process of claim 1 wherein said electrical contacts provided on said integrated circuit are formed of indium or gold.

7. A process of making an optoelectronic switching array comprising:
   (a) providing a first GaAs substrate;
   (b) forming by sputtering a conductive layer on said first substrate;
   (c) forming by sputtering a layer of ferroelectric material on said conductive layer;
   (d) providing a second GaAs substrate;
   (e) forming by sputtering an integrated circuit on said second GaAs substrate;
   (f) forming a plurality of electrical contacts on said integrated circuit; and
   (g) connecting the two subassemblies respectively formed on each of said first and second GaAs substrates by placing one on top of the other so that said plurality of electrical contacts abut said layer of ferroelectric material.

8. The process of claim 7 wherein said first and second GaAs substrates are first polished and cleaned by chemical solutions in ultrasonic baths, followed by sputter etching the surfaces of said substrates.

9. The process of claim 7 wherein said plurality of electrical contacts on said integrated circuit are formed by tape automated bonding.

10. The process of claim 7 wherein said layer of ferroelectric material is one of a group consisting of PZT and PLZT, and lead-germanate and, wherein said conductive layer is one of a group consisting of noble metals, gold and platinum, and conductive oxides, $SnO_2$ and $InSnO_2$.

11. The process of claim 7 wherein said plurality of electrical contacts on said integrated circuit are formed by flip chip bonding.

* * * * *